United States Patent [19]
Akiyama

[11] 3,936,694
[45] Feb. 3, 1976

[54] DISPLAY STRUCTURE HAVING LIGHT EMITTING DIODES

[75] Inventor: Katsuhiko Akiyama, Atsugi, Japan

[73] Assignee: Sony Corporation, Tokyo, Japan

[22] Filed: Dec. 23, 1974

[21] Appl. No.: 535,173

[30] Foreign Application Priority Data
Dec. 28, 1973 Japan.................................. 49-3360
Nov. 21, 1974 Japan.............................. 49-134643

[52] U.S. Cl. ...................... 313/500; 29/589; 357/17
[51] Int. Cl.$^2$........................................... H01I 15/00
[58] Field of Search ......... 313/500; 357/17; 29/587, 29/589, 591, 588, 576 S, 626

[56] References Cited
UNITED STATES PATENTS

| | | | |
|---|---|---|---|
| 3,368,276 | 2/1968 | Renskers............................... | 29/626 |
| 3,573,568 | 4/1971 | Siegel..................................... | 357/17 |
| 3,886,581 | 5/1973 | Katsumura et al..................... | 357/17 |

*Primary Examiner*—John Kominski
*Attorney, Agent, or Firm*—Hill, Gross, Simpson, Van Santen, Steadman, Chiara & Simpson

[57] ABSTRACT

A display structure comprising a substrate of transparent dielectric material, a first layer of copper on one major surface of the substrate etched to provide a plurality of conductive paths leading to a plurality of light emitting diodes disposed on the substrate in a display configuration, the junction plane of each diode being disposed perpendicular to the substrate. The spacing between two conductive paths which provide a potential difference across the diode at the point where the diode is located being slightly greater than the distance between the two electrodes of the diode. A solder paste mechanically secures the diode in place and electrically connects the electrodes of the diode to their associated conductive paths. A second layer of copper is formed on the other major surface of the substrate is etched to provide openings therethrough to said substrate below the location of each diode. These openings are slightly wider than the spacing between the two conductive paths to which the diode is connected. The second layer of copper is preferably blackened, such as by applying a so-called black-nickel plating consisting of alloy plating of zinc, sulpher and nickel.

In a second form of the invention, a nickel layer covers the first copper layer. The conductive paths are then formed in the first copper layer by etching out both the nickel layer and the first copper layer. A further etching under-etches the nickel layer to form overhanging eaves. The eaves facing each diode are bent down when the diode is forced into the etched opening which provides both mechanical support as well as an electrical connection with their associated conductive paths. Preferably, the nickel layer and first copper layer are coated where exposed with tin.

A solder paste may alternatively be used with the down bent eaves of the nickel layer to electrically connect the nickel layer to the electrically conductive paths.

A fourth form of the invention employs an iron plate in place of the first copper layer and copper in place of nickel for the layer providing the overhanging eaves. An etched copper layer extends down from the iron layer into the substrate. A black ceramic layer underlies the transparent substrate. The diodes in this case are viewed from above rather than from below as in the other three embodiments.

12 Claims, 26 Drawing Figures

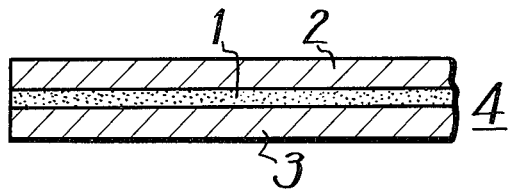
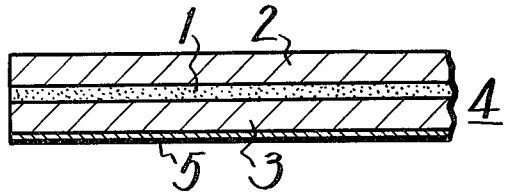
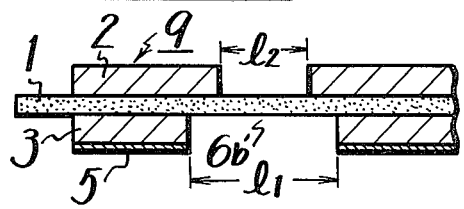
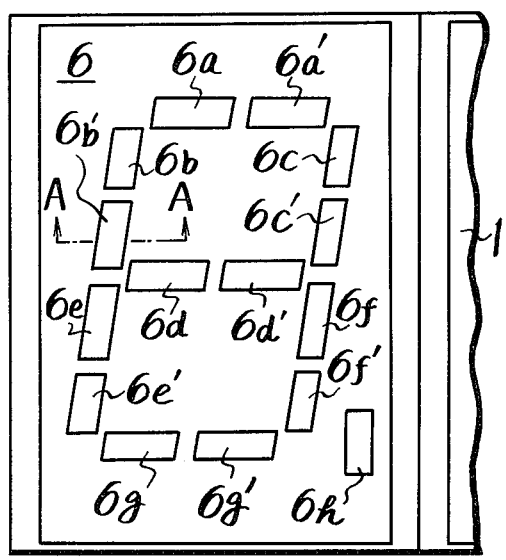
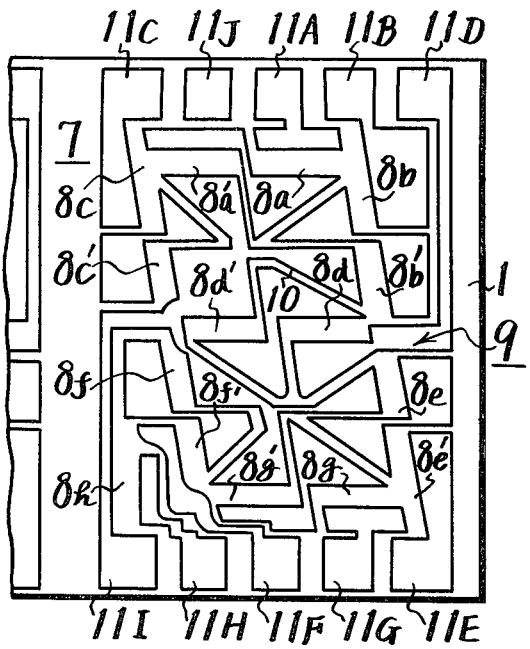
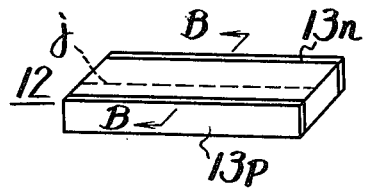

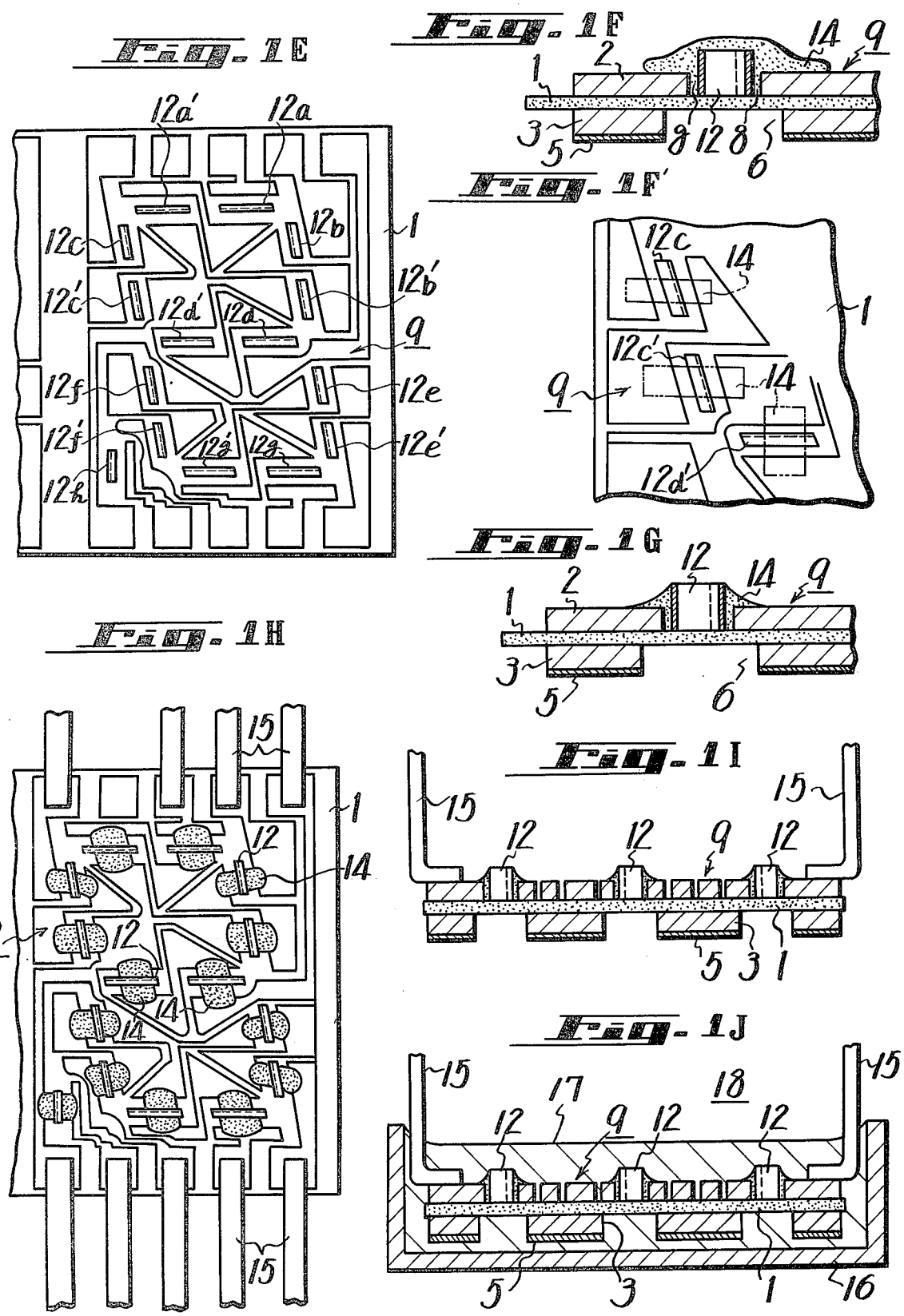

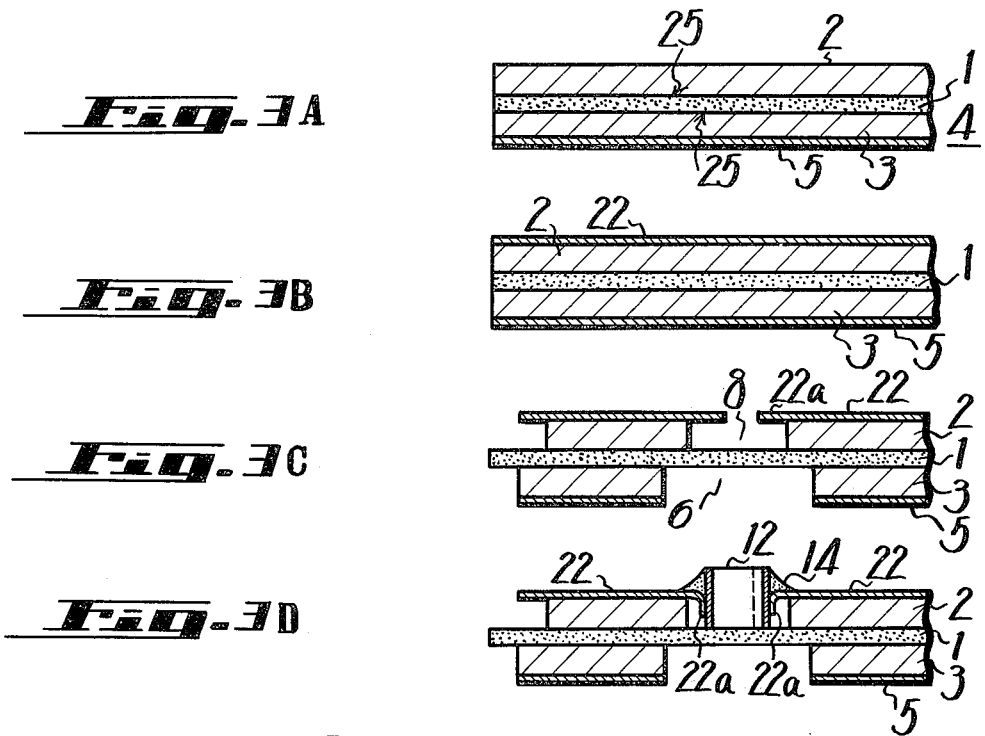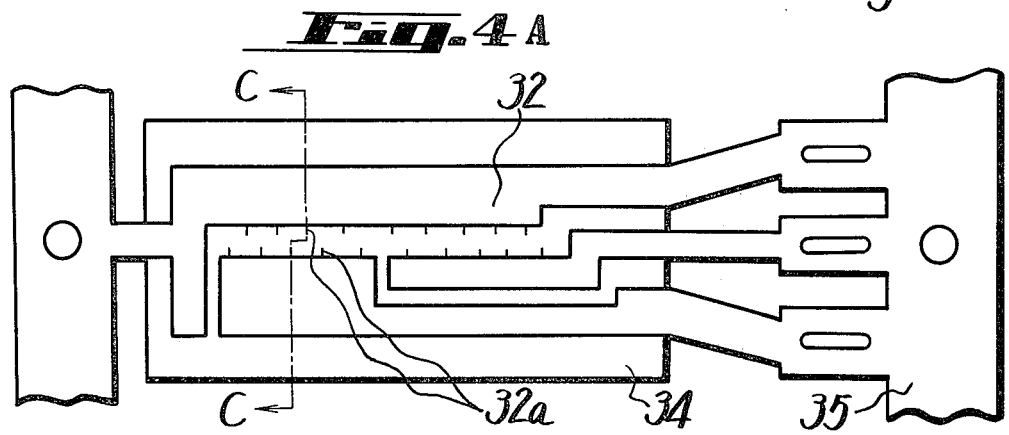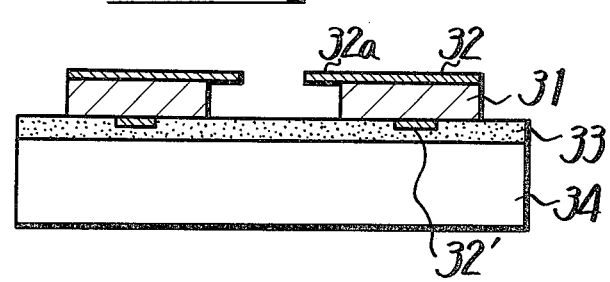

DISPLAY STRUCTURE HAVING LIGHT EMITTING DIODES

BACKGROUND OF THE INVENTION

1. Field of the Invention

The invention relates mainly to a display device having light emitting semiconductor elements and particularly to a display device in which the semiconductor elements are securely supported by a simple construction.

2. Description of the Prior Art

In a prior art display device utilizing light emitting semiconductor elements, the electrodes of each element are arranged to be positioned at the upper and lower sides, in order to be positively supported on the substrate. In this case, however, it is relatively difficult to connect the electrodes of the element to the conductive members by soldering. For this reason, the upper electrode of the element sometimes needs a lead-wire for its connection which makes its construction quite complicated.

SUMMARY OF THE INVENTION

Accordingly, one object of this invention is to provide a display device in which semiconductor elements are securely supported by supporting members for solid connection to conductive members with a simple construction.

Another object of this invention is to provide a display device in which semiconductor elements are easily and positively soldered to conductive members.

A further object of this invention is to provide a display device which has an effect of enlargement when being observed.

A still further object of this invention is to provide a display device in which a distinct display can be achieved.

Yet another object of this invention is to provide a display device which is easy to manufacture and low in cost.

The additional and other objects, features and advantages of this invention will become apparent from the following description taken in conjunction with the accompanying drawings.

BRIEF DESCRIPTION OF THE DRAWINGS

FIGS. 1A to 1J are diagrams of manufacturing processes showing one example of a display device according to this invention;

FIGS. 3A to 3D are cross-sectional views in the order of the manufacturing process, showing a further example of this invention;

FIG. 4A is a plan view showing still another example of this invention; and

FIG. 4B is a cross-sectional view taken along a line C-C of FIG. 4A.

DESCRIPTION OF THE PREFERRED EMBODIMENTS

Figure 2A:
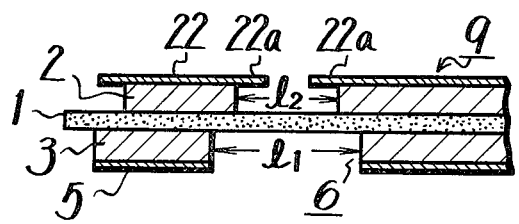
FIGS. 2A to 2D are cross-sectional views in the order of the manufacturing process, showing another example of this invention.

A description will hereinafter be given of one embodiment of a display device according to this invention and its manufacturing method with reference to the drawings. Cross-sectional views in FIGS. 1C, 1F, and 1G are those taken along a line A—A in FIG. 1C' for simplifying the understanding of its explanation.

In this invention, a light-transparent insulating sheet 1 is attached at its opposite surfaces with metal layers or copper plates 2 and 3 by adhesive agent to form a substrate 4 as shown in FIG. 1A. In this case, as the sheet 1, it is preferred to use a relatively thin film such as a light-transparent resin film consisting of polyimide resin, polyester resin or the like and having a thickness of about $50\mu$ (micron). In addition, the copper plates 2 and 3 are preferred to have a thickness of about $70\mu$ each.

Next, the surface of the copper plate 3 formed on one surface of the sheet 1 is subjected to a blackening process. The blackening process is effected by applying a so-called black-nickel plating 5 consisting of alloy plating of zinc, sulpher and nickel. In this case, the thickness of the black-nickel plating 5 is made about $1\mu$ maximum, by way of example (see FIG. 1B).

Then, the copper plate 3 applied with the black-nickel plating 5 and the other copper plate 2 are respectively removed by etching in different patterns by using a normal photo-etching technique (see FIG. 1C). In this case, as shown in FIG. 1C' an etching pattern 6 on the copper plate 3 is selected such as to form recesses 6a, 6a'; 6b, 6b'; ... ; 6g, 6g'; and 6h at the respective sides of 8-shaped configuration corresponding to a pattern of plural light emitting semiconductor elements. These semiconductor elements will be later disposed at the side of copper plate 2 in 8-shaped pattern in this example. In the illustrated example, each of the respective sides forming 8-shaped pattern is halved, that is, a pair of two halves form one side or element.

Further, as shown in FIG. 1C'', at a portion of the copper plate 2 corresponding to the etching pattern 6 of the copper plate 3 there is formed an etching pattern 7 such as to have grooves 8 (8a, 8a'; 8b, 8b'; ... ; 8g, 8g'; and 8h) in which light emitting semiconductor elements are disposed in grooves 10 in which wiring portions 9 are formed as if surrounding the aforesaid grooves 8. The pattern of the wiring portions 9 can be chosen in various shapes. In this example, however, external terminal portions corresponding to eight elements forming 8-shaped configuration are formed facing the upper and lower end portions. In other words, reference 11I designates a common terminal, 11A to 11H terminals each corresponding to each pair of two elements forming the 8-shaped pattern, and 11J a free terminal. Meanwhile, each lead-wire, though not shown, used for connecting two light emitting semiconductor elements in series is formed corresponding to each of eight elements.

In case of etching the copper plates 2 and 3, it is preferred that a width $l_1$ (or a length) of each recess 6 formed by etching the copper plate 3 be selected larger than a width $l_2$ (or a length) of each corresponding groove 8 formed by etching the copper plate 2.

After the copper plates 2 and 3 are etched each in a predetermined pattern, as shown in FIG. 1E light emitting semiconductor elements 12 (12a, 12a'; 12b, 12b'; ... ; 12g, 12g'; and 12h) are respectively disposed in the grooves 8a, 8a'; 8b, 8b'; ... 8g, 8g'; and 8h at the side of copper plate 2 forming the 8-shaped configuration.

The light emitting semiconductor element 12 is provided with PN-junction j as depicted in FIGS. 1D and 1D'. FIG. 1D' is a cross-sectional view of the semiconductor element 12 taken along a line B—B of FIG. 1D.

Electrodes 13p and 13n are connected by deposition to the end surfaces of its P-type and N-type regions in ohmic contact therewith to form a GaP light emitting diode, by way of example. In disposing such an element 12 in each of the grooves 8, for example, the P-type region is adapted to oppose the wiring portion connected to the common terminal 11I, that is, in the illustrated example, the P-type region is adapted to face the inside of the 8-shaped pattern.

At the next stage, flux (not shown) is coated over the entire surface of the substrate 4 at the side where each element 12 is disposed in order to solder as well as to secure the element 12 to the substrate 4. Thereafter, as shown in FIGS. 1F and 1F' solder paste 14 is coated on the element 12 thereacross and extending on the wiring portions 9 which are respectively opposed to the electrodes 13p and 13n of the element 12 for being connected thereto by means of, for example, a silk screen printing method or the like. At this time, the solder paste 14 is also filled in gaps g between the electrodes 13p and 13n of the element 12 and the wiring portions 9. Accordingly, the accuracy in the lateral dimension of the element 12 and that of the groove 8 in which the element 12 is disposed is not particularly severe.

Then, a heating process is applied thereto in a heating furnace at a temperature of 170°C maximum, normally more than 160°C for 1.5 minutes. With the above arrangement, the solder paste 14 is melted and both the electrodes 13p and 13n of the element 12 and the wiring portions 9 in opposition thereto are electrically connected by the solder paste 14 as shown in FIG. 1G. In this case, the portion of solder paste coated on the upper surface of the element 12 having no electrode thereon flows to the sides of both electrodes 13p and 13n due to cohesive phenomenon of solder and hence no solder attaches onto the upper surface of the element 12 (see FIG. 1G).

Then, as shown in FIG. 1H each of external lead wires 15 made of "Kovar" or the like is connected to each of the terminals 11A to 12I and then bent as shown in FIG. 1I. Kovar is a low expansion iron based alloy with 28–30% nickel, 15–18% cobalt and a fractional percent of manganese. Next, as shown in FIG. 1J, the thus constructed portion including the elements 12 is inserted into a transparent casing 16 made of resin or the like with its black-nickel plating 5 being made a display surface, and then suitable resin 17 is filled in the casing 16. Thus, there can be obtained an aimed display device 18 using the light emitting semiconductor elements.

With the thus constructed display device 18, the common terminal 11I is applied with a negative potential while the other terminals 11A to 11H corresponding to the respective elements forming 8-shaped configuration are selectively applied with a positive potential with the result that semiconductor elements in the selected grooves emit light to display a desired numeral through the recesses 6 of the copper plate 3.

According to the above described construction, the light transparent insulating sheet 1 is coated at its opposite surfaces with the metal layers 2 and 3 such as copper plate to form the substrate 4, the metal layers 2 and 3 are etched in patterns such as shown in FIGS. 1C", and 1C', respectively, the one metal layer 2 having the wiring portions 9 is disposed therein with the light emitting semiconductor elements 12, and the other metal layer 3 is used as a display mask. As a result, the display device using the light emitting semiconductor elements of this kind can be easily manufactured and also simplified in construction resulting in low price. In addition, the metal layer 3 used as a display mask is previously applied on its surface with the blackening process such as the black-nickel plating 5 thereby to improve the display contrast for its distinct display. Further, when the element 12 emits a light, since the recess 6 of the metal layer 3 as a display mask is formed larger in size than the groove 8 of its rear side wherein the element 12 is disposed and also the sheet 1 is formed thin, light from the element 12 is passed through the sheet 1 without being scattered about and observed with an effect of enlargement by means of the larger recess 6.

Such a display device according to this invention can be variously improved.

FIGS. 2A to 2D show an improved embodiment of this invention, in which the element 12 is positively secured to the substrate 4 when the same is disposed in the groove 8 so as to achieve the smoothness of the following process. That is, in advance of etching process to the copper plates 2 and 3, a nickel layer 22 is plated on the copper plate 2 to be disposed with the elements 12. Thereafter, in the case of etching the copper plate 2, firstly the nickel layer 22 and the copper plate 2 are etched with narrow etching width, and then the copper plate 2 is over-etched in a predetermined width with the nickel layer 22 being used as a mask. In other words, as depicted in FIG. 2A, eaves 22a of the nickel layer 22 are formed by the above over-etching process, at least, at a portion over the groove 8 wherein the element 12 is disposed. In the above etching process, the final etching width $l_2$ of the copper plate 2 obtained by the over-etching is selected in a predetermined size which has been described with reference to FIG. 1.

Figure 2B:
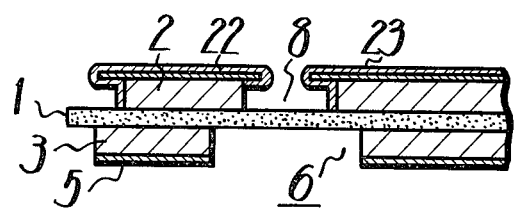
Figure 2C:
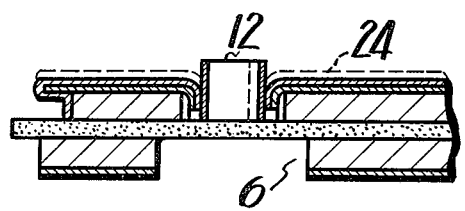
Figure 2D:
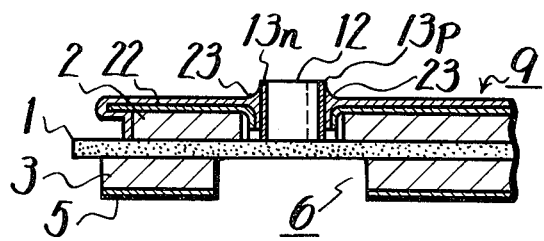
Figure 2B:
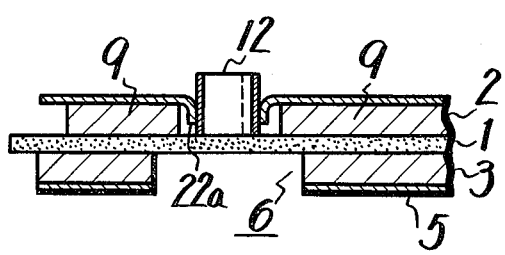
Figure 2C:
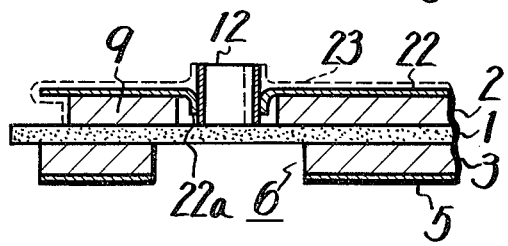

After the eaves 22a of the nickel layer 22 are thus formed, a tin plating layer 23, by way of example, is formed by deposition on the surface including the nickel layer 22 and a copper plate 2 as shown in FIG. 2B. Next, the element 12 is inserted into each groove 8 having the eaves 22a thereon by pressing down the respective eaves 22a. In this case, the element 12 is resiliently supported by the eaves 22a as shown in FIG. 2C. Besides, the electrodes 13p and 13n of the element 12 are electrically brought into contact with the copper plates 2 through the tin plating layers 23 and the nickel layers 22. After flux 24 is applied on the tin plating layers 23 with the above described condition as shown in FIG. 2C, an alloy process is applied thereto. Thus, the tin plating layers 23 are subjected to an alloy process as shown in FIG. 2D to connect the electrodes 13p and 13n of the element 12 to the copper plates 2 or wiring portions 9 in an electrical and mechanical manner.

Meanwhile, with a condition where the eaves 22a are formed, the element 12 is inserted into the groove 8 by pushing down the eaves 22a directly and supported resiliently by the curved portions of the eaves 22a of the nickel layers as shown in FIG. 2B', thus the electrical and mechanical connection between the element 12 and wiring portions 9 being completed. Otherwise, as shown in FIG. 2C', the tin plating layer 23 is further deposited on the nickel layer 22 and then alloy process may be applied thereto to obtain a construction shown in FIG. 2D.

When the eaves 22a are provided at the end edges of the wiring portions 9 facing the groove 8 and the eaves 22a are pushed down to insert the element 12, the element 12 is securely supported by the eaves 22a in a mechanical manner. Accordingly, the operation in the following process can be smoothly carried out, that is, the element can be prevented from being shaken and fallen out in its transportation and precise coupling with no positional shift can occur.

FIGS. 3A to 3D show another improved embodiment of this invention, in which the light emitting display is made to look larger, particularly even with small light emitting semiconductor elements. That is, a so-called effect of enlargement is achieved. In other words, there is first provided a sheet 1 which is previously applied with aventurine lacquer 25 on its opposite surfaces and then the copper plates 2 and 3 are formed by deposition on both the surfaces of this sheet 1 to form the substrate 4 as shown in FIG. 3A. Further, the surface of one copper plate 3 is subjected to the black-nickel plating 5 as occasion demands. Thereafter, in the case where the eaves are to be provided similarly as the case of FIGS. 2A to 2D, the nickel layer 22 is deposited on the surface of the copper plate 2 (see FIG. 3B) and then the copper plates 2 and 3 together with the nickel layer 22 are subjected to etching process to form the eaves 22a on the nickel layer 22, thus a predetermined pattern being formed as shown in FIG. 3C. In this case, the aventurine lacquer 25 comes out to the outside at etched portions. Further, the recess 6 formed in the copper plate 3 is made larger than the groove 8 of the copper plate 2.

Next, the element 12 is inserted into the groove 8 of the copper plate 2 and they are connected by the solder paste 14 as shown in FIG. 3D.

With such a construction, the light emitted from the element 12 is observed through the transparent sheet 1 from the side of copper plate 3. In this case, since the surface of the sheet 1 is applied with the aventurine lacquer 25, the light is reflected diffusively to perform a display with a moderate by bold figure.

FIGS. 4A and 4B show a further improved embodiment of this invention. At first, an iron plate 31 with a thickness of about 250μ is applied with a copper plating having a thickness of about 20μ at its opposite surfaces with a photo resist being used as a mask to form a copper layer 32 and copper marks 32' in predetermined patterns. In this case, a gap between the copper layers 32 on the upper side is made substantially 0.6 mm and both the layers 32 have projected therefrom comb-like electrodes each being substantially 0.5 mm in pitch, 100μ in width and 225μ in length.

Next, a black ceramic substrate 34 having a thickness of about 8 mm is secured to the lower surface of the iron plate 31 through epoxy resin 33 or the like with the copper marks 32' formed on the bottom surface being used as its guide.

Thereafter, the iron plate 31 is etched in a lead-frame shape 35 with the copper layer 32 being used as a mask as shown in FIG. 4A. In this case, the iron plate 31 is over-etched by 100 to 150μ to form eaves 32a of the copper layer 32. Then, a solder plating with thickness of about 20μ is applied on the surface including the copper layer or electrodes 32 and the iron plate 31. Next, a GaP light emitting semiconductor element, which is substantially 4 mm long, 0.5 mm wide and 180μ high, is inserted between the eaves 32a of the copper layer 32 with the PN-junction of the element being perpendicular to the substrate 34 and finally subjected to a soldering process.

In the embodiment of the invention shown in FIGS. 4A and 4B, the diodes are viewed from the side of the structure opposite to that where the opaque black ceramic layer lies, i.e., from above as seen in FIG. 4B.

It is needless to say that this invention is not limited to numeral display but also applicable to various devices for displaying characters, signs and the like.

As described above, with this invention the display device utilizing light emitting semiconductor elements can be obtained with a very simple construction, and also it is possible to simplify its manufacturing and to provide it with small size and low price.

It will be apparent to those skilled in the art that many modifications and variations may be effected without departing from the spirit and scope of the novel concepts of the present invention.

I claim as my invention:

1. A display structure comprising:
   a. a substrate of insulating material;
   b. a plurality of light emitting diodes disposed on one major surface of said substrate in a predetermined pattern with their pn junctions perpendicular to said substrate;
   c. multi-layer paths carried on said one surface of said substrate,
      at least the outer layer of which is formed of conductive material;
   d. said paths being shaped to provide recesses, each larger than the width of a diode;
   e. said diodes being in said recesses with the outer layer of an associated one of said multi-layer paths bent down into said recess to mechanically grip and electrically connect with each diode.

2. A display structure according to claim 1, in which an additional layer is formed on the opposite major surface of said substrate, in which openings are provided through said additional layer below the location of each light emitting diodes, said openings being wider than the width of the recess lying thereabove, and in which said substrate is transparent.

3. A display device according to claim 1, in which a conductive adhesive is also provided between said conductive paths and said diodes.

4. A display device according to claim 1, in which the recesses provided by said multi-layer paths are wider in the innermost layer than in the outermost layer, whereby a portion of said outermost layer overhangs the innermost layer.

5. A display structure comprising:
   a. a substrate of transparent insulating material;
   b. a first copper layer on one major surface of said substrate;
   c. a nickel layer covering the outer surface of said first copper layer;
   d. a second copper layer on the other major surface of said substrate;
   e. a plurality of light emitting diodes each having a positive and a negative electrode;
   f. said first copper layer and its associated first nickel layer being formed to provide a plurality of conductive paths to said diodes to enable selective energization of the diodes;
   g. said first copper layer being shaped to provide openings in which each diode is mounted, which openings are wider than the spacing between the electrodes of a diode;
   h. said first nickel layer being shaped to provide openings corresponding to and aligned with the openings of said first copper layer but of narrower width, the overhanging eaves of said first nickel layer being bent down into the opening of said first copper layer;

i. one of said diodes being disposed between and mechanically held by said bent down eaves and in electrical contact therewith.

6. A display structure according to claim 5, in which there is a black nickel plating on the outer surface of said second copper layer.

7. A display character according to claim 5, in which a coating of tin covers the exposed surface of said nickel layer and first copper layer.

8. A display structure according to claim 5, in which each eave is soldered to the electrode of its associated diode.

9. A display structure according to claim 5, in which said second copper layer has windows therethrough below each diode, said windows being wider than said recesses in said first copper layer.

10. A display structure comprising:
    a. a substrate of insulating material;
    b. a first conductive metal layer on one major surface of said substrate;
    c. a layer of a different conductive metal covering the outer surface of said first conductive metal;
    d. a plurality of light emitting diodes each having a positive and a negative electrode adapted to be connected across a potential source;
    e. said two conductive layers being formed to provide a plurality of conductive paths from said potential source to said diodes to enable selective energization of said diodes;
    f. said first conductive layer being shaped to provide openings in which each diode is mounted with its pn junction perpendicular to said substrate and which openings are wider than the spacing between the positive and negative electrodes of a diode;
    g. said second conductive layer being shaped to provide openings corresponding to and aligned with the openings in said first conductive layer but of narrower width, the overhanging eaves of said second conductive layer being bent down into the openings of said first conductive layer;
    h. each pair of aligned openings having a diode disposed therein between said bent down eaves with its electrodes in electrical contact with the respective electrodes of such diode.

11. An alpha-numeric character display structure comprising:
    a. a substrate of transparent insulating material;
    b. a first conductive metal layer on one major surface of said substrate;
    c. a layer of a different conductive metal covering the outer surface of said first conductive metal;
    d. a layer of stiff material on the other major surface of said substrate;
    e. a plurality of light emitting diodes each having a positive and a negative electrode adapted to be connected across a potential source;
    f. said two conductive layers being formed to provide a plurality of conductive paths from said potential source to said diodes to enable selective energization of said diodes;
    g. said first conductive layer being shaped to provide openings in which each diode is mounted with its pn junction perpendicular to said substrate and which openings are wider than the spacing between the positive and negative electrodes of a diode;
    h. said second conductive layer being shaped to provide openings corresponding to and aligned with the openings in said first conductive layer but of narrower width, the overhanging eaves of said second conductive layer being bent down into the openings of said first conductive layer;
    i. each pair of aligned openings having a diode disposed therein between said bent down eaves with its electrodes in electrical contact with the respective electrodes of such diode.

12. A display structure comprising:
    a. a substrate of opaque insulating material;
    b. an epoxy layer on one surface of said substrate;
    c. a first metal layer of iron on said epoxy layer;
    d. a second metal layer of copper on said layer of iron;
    e. a plurality of light emitting diodes each having a positive and a negative electrode adapted to be connected across a source of potential;
    f. said metal layer being shaped to provide a plurality of conductive paths from said potential source to said diodes;
    g. said iron metal layer being shaped to provide openings in which each diode is mounted with its pn junction perpendicular to said substrate and which openings are wider than the spacing between the positive and negative electrodes of a diode;
    h. said copper layer being shaped to provide openings corresponding to the openings in said iron layer but of narrower width;
    i. each of said openings in said copper layer having a diode disposed therein seated on said substrate with their respective electrodes abutting opposite eaves of said copper layer.

* * * * *